US009013571B2

(12) United States Patent
Abe

(10) Patent No.: US 9,013,571 B2
(45) Date of Patent: Apr. 21, 2015

(54) IMAGE PROCESSING DEVICE, MEASURING/TESTING SYSTEM, AND PROGRAM

(75) Inventor: Yuichi Abe, Mito (JP)

(73) Assignee: Hitachi High-Technologies Corporation, Tokyo (JP)

(*) Notice: Subject to any disclaimer, the term of this patent is extended or adjusted under 35 U.S.C. 154(b) by 389 days.

(21) Appl. No.: 13/516,565

(22) PCT Filed: Dec. 17, 2010

(86) PCT No.: PCT/JP2010/072780
§ 371 (c)(1),
(2), (4) Date: Jun. 15, 2012

(87) PCT Pub. No.: WO2011/074671
PCT Pub. Date: Jun. 23, 2011

(65) Prior Publication Data
US 2012/0257039 A1 Oct. 11, 2012

(30) Foreign Application Priority Data

Dec. 18, 2009 (JP) ................. 2009-288140

(51) Int. Cl.
H04N 9/47 (2006.01)
H04N 7/18 (2006.01)
(Continued)

(52) U.S. Cl.
CPC ............. *G06T 7/0081* (2013.01); *G06T 7/0091* (2013.01); *G06T 2207/10061* (2013.01); *G06T 2207/20141* (2013.01);
(Continued)

(58) Field of Classification Search
USPC .................................... 348/41–161
See application file for complete search history.

(56) References Cited

U.S. PATENT DOCUMENTS 7,085,401 B2* 8/2006 Averbuch et al. ............. 382/103
7,412,671 B2* 8/2008 Ito et al. ........................ 716/136
(Continued)

FOREIGN PATENT DOCUMENTS

JP 11-120331 A 4/1999
JP 11-272865 A 10/1999
(Continued)

OTHER PUBLICATIONS

Nguyen et al., "Watersnakes: Energy-Driven Watershed Segmentation", IEEE Transactions on Pattern Analysis and Machine Intelligence, Mar. 2003, vol. 25, No. 3, pp. 330-342 (thirteen (13) sheets).
(Continued)

*Primary Examiner* — Joseph Ustaris
*Assistant Examiner* — Talha Nawaz
(74) *Attorney, Agent, or Firm* — Crowell & Moring LLP

(57) ABSTRACT

The present invention provides a contour extraction technique capable of resolving not only spuriousness, duplication, or branches in the contours of a sample pattern, but also discontinuities in the contours. A thinning process is performed with respect to design data for generating a sample pattern, and pattern in/out definition information defining the inside and outside of a pattern formed on a target sample is generated. Then, based on the Marker Controlled Watershed Segmentation method, region segmentation is performed by expanding regions indicated by the pattern in/out definition information while referencing pixel values of an edge-enhanced image of a target sample image, and pattern contours are generated.

9 Claims, 12 Drawing Sheets

(51) Int. Cl.
  *G01N 23/00* (2006.01)
  *G06K 9/00* (2006.01)
  *G06T 7/00* (2006.01)
  *H01L 21/66* (2006.01)

(52) U.S. Cl.
  CPC ........... *G06T 2207/20152* (2013.01); *G06T 2207/30148* (2013.01); *H01L 22/12* (2013.01); *H01L 2924/0002* (2013.01)

(56) References Cited

U.S. PATENT DOCUMENTS

| | | | |
|---|---|---|---|
| 7,732,792 B2 * | 6/2010 | Matsuoka et al. | 250/492.22 |
| 7,978,904 B2 * | 7/2011 | Toyoda et al. | 382/149 |
| 8,041,104 B2 | 10/2011 | Toyoda et al. | |
| 8,045,785 B2 | 10/2011 | Kitamura et al. | |
| 8,369,590 B2 * | 2/2013 | Wang et al. | 382/128 |
| 8,445,871 B2 * | 5/2013 | Matsuoka et al. | 250/492.22 |
| 8,543,519 B2 * | 9/2013 | Guyon et al. | 706/12 |
| 2006/0045326 A1 | 3/2006 | Toyoda et al. | |
| 2008/0175469 A1 * | 7/2008 | Toyoda et al. | 382/149 |
| 2009/0039263 A1 * | 2/2009 | Matsuoka et al. | 250/311 |

FOREIGN PATENT DOCUMENTS

| | | |
|---|---|---|
| JP | 2001-338304 A | 12/2001 |
| JP | 2005-165969 A | 6/2005 |
| JP | 2006-66478 A | 3/2006 |
| JP | 2006-190207 A | 7/2006 |
| JP | 2006-238802 A | 9/2006 |
| JP | 2009-15735 A | 1/2009 |

OTHER PUBLICATIONS

Hodneland et al., "Four-Color Theorem and Level Set Methods for Watershed Segmentation", International Journal of Computer Vision, May 2009, vol. 82, No. 3, pp. 264-283 (twenty (20) sheets).
Corresponding International Search Report with English Translation dated Jan. 18, 2011 (four (4) pages).
Form PCT/ISA/237 (three (3) pages).

* cited by examiner (a)

(b)

(a)

(b)

(c)

(d)

Pattern in/out definition information (e)

(a)

(b)

(c)

(a)            (b)

(a)

(b)

IMAGE PROCESSING DEVICE, MEASURING/TESTING SYSTEM, AND PROGRAM

TECHNICAL FIELD

The present invention relates to an image processing device, measuring/testing system, and program, and, more particularly, to a technique for performing contour extraction of a pattern on a sample.

BACKGROUND ART

Techniques for extracting contours from a target image, such as an SEM image of a semiconductor pattern, and so forth, are referred to as edge extraction or contour extraction and have conventionally been in popular use. By way of example, Patent Literature 1 discloses a technique in which edges are extracted by performing thresholding and thinning after edge enhancement using a non-linear second-order derivative filter, the extracted edges are linked, and contours of the pattern are constructed by linear approximation. For edge enhancement, first-order derivative filters, such as the Sobel filter, etc., may sometimes be used besides second-order derivative filters.

However, such methods that extract edges from local information were problematic in that they caused discontinuity, spuriousness, duplication, branches, etc., in the contours of semiconductor patterns.

On the other hand, techniques that search for pre-registered shapes from a target image are known as template matching and are in wide use. Further, by way of example, Patent Literature 2 discloses a method in which design data, which is the base data for generating a semiconductor pattern, and a semiconductor pattern are aligned through template matching, and edges extracted with a first-order derivative or second-order derivative filter are mapped to the design data, thereby constructing contours of the pattern. According to this method, it is possible to resolve spuriousness, duplication, or branches in the edges of the contours.

CITATION LIST

Patent Literature

Patent Literature 1: JP Patent Application Publication (Kokai) No. 2006-66478 A
Patent Literature 2: JP Patent Application Publication (Kokai) No. 2001-338304 A

Non-Patent Literature

Non-Patent Literature 1: IEEE transactions on Pattern Analysis and machine Intelligence, 25(3):330-342, March 2003, "Water snakes Energy driven Watershed segmentation," H. T. Nguyen, M. Worring and R. V. D Boomgard
Non-Patent Literature 2: International Journal of Computer Vision, v.82 n.3, p. 264-283, May 2009, "Four-Color Theorem and Level Set Methods for Watershed Segmentation," Erlend Hodneland, Xue-Cheng Tai, Hans-Hermann Gerdes

SUMMARY INVENTION

Technical Problem

However, when the technique disclosed in Patent Literature 2 is used, although problems of spuriousness, duplication, and branches in the edges of the pattern contours may be resolved, discontinuities in the contours may sometimes persist.

The present invention is made in view of such circumstances, and provides a technique that is capable of resolving not only spuriousness, duplication, and branches in the contours of a sample pattern, but also discontinuities in the contours.

Solution to Problem

In order to solve the problems above, with the present invention, a thinning process is performed with respect to design data for generating a test target sample, and pattern in/out definition information defining the inside and outside of a pattern formed on the target sample is generated. Then, region segmentation is performed by expanding regions indicated by the pattern in/out definition information while referencing pixel values of an edge-enhanced image of a target sample image, thereby generating pattern contours of the target sample.

When generating contours, region segmentation is performed in such a manner that the regions indicated by the pattern in/out definition information are expanded, and that the inside region of the pattern overlaps as much as possible with an edge part indicated by the edge-enhanced image (since the obtained edge-enhanced image may in some cases be discontinuous and may not necessarily overlap 100%). By way of example, region segmentation is performed based on the Marker Controlled Watershed Segmentation method. Alternatively, pattern contours of the target sample are generated by executing an active contour extraction process using, from the pattern in/out definition information, external energy indicating a pattern interior region and external energy indicating a pattern exterior region. Examples of such an active contour extraction process include the snake method and the level set method.

When generating the pattern in/out definition information, alignment information obtained through a matching process between the target sample image and the design data is referenced, and a peeling process is performed with respect to an image of an internal region and external region of the pattern with respect to the design data. In this case, the design data may be morphed so as to envelop the target sample image, and the pattern in/out definition information may be generated from the morphed design data.

In addition, when generating the edge-enhanced image, a plurality of filter processes may be performed on the sample image, and the respective filter processed images may be combined.

Further features of the present invention will become apparent from the following best modes for carrying out the present invention and the accompanying drawings.

Advantageous Effects of Invention

With a process of the present invention, it is possible to resolve not only spuriousness, duplication, and branches in the contours of a sample pattern, but also discontinuities in the contours.

DESCRIPTION OF EMBODIMENTS

Figure 1:
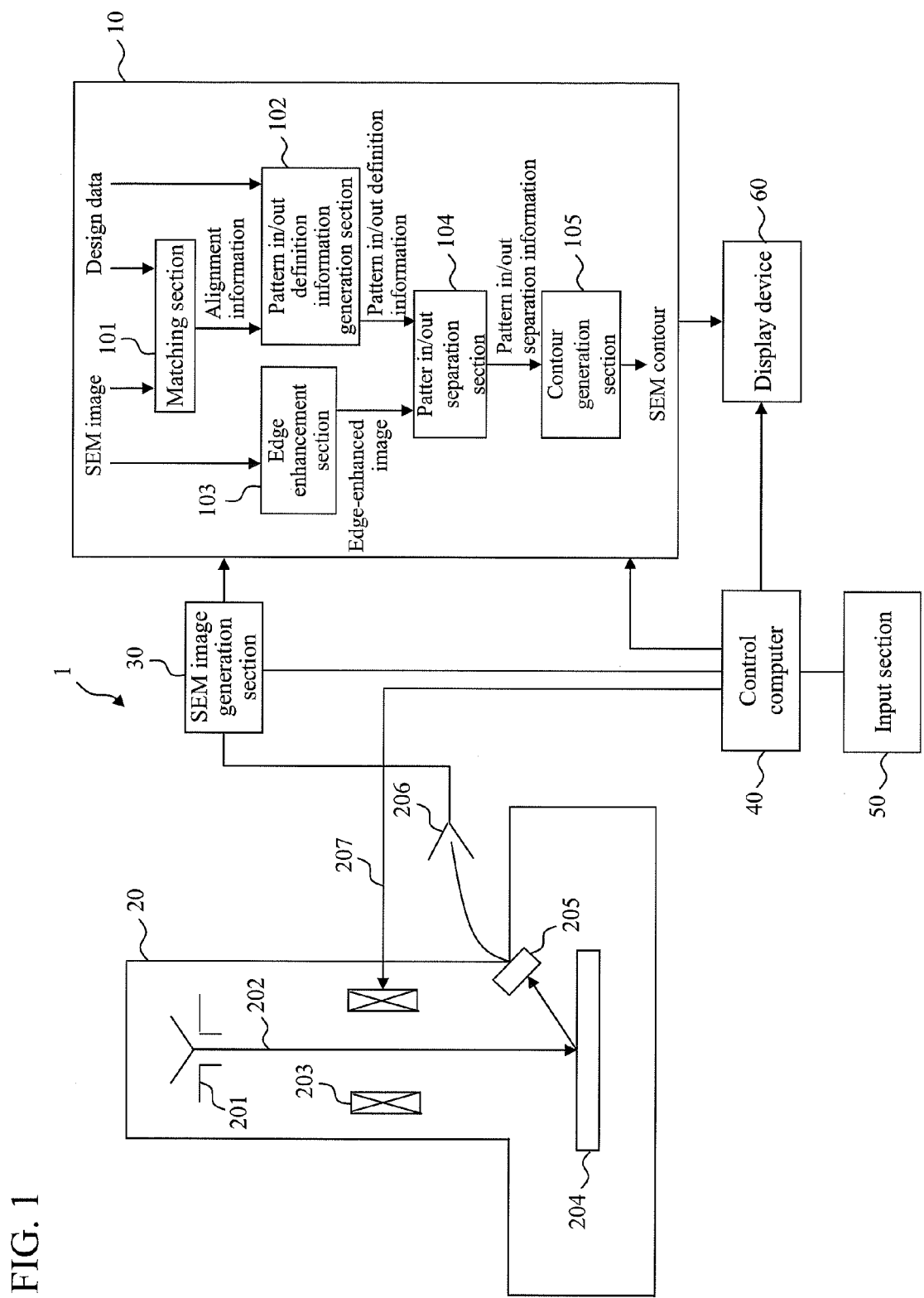
FIG. 1 is a diagram showing a schematic configuration of a measuring/testing system according to an embodiment of the present invention.

The present invention relates to a technique for generating pattern contours without branches, duplication, and discontinuities by generating pattern in/out definition information defining the inside and outside of a pattern based on an image obtained by an electron microscope (e.g., an SEM image) and on design data, and executing a segmentation process using it and an edge image.

Embodiments of the present invention are described below with reference to the accompanying drawings. However, it is to be noted that these embodiments are merely examples for realizing the present invention, and that they do not by any means limit the technical scope of the present invention. In addition, like elements are designated with like reference numerals across the drawings.

(1) First Embodiment

<Configuration of Measuring/Testing Device>

FIG. 1 is a diagram showing a schematic configuration of a measuring/testing system (or "image observing system") 1 according to an embodiment of the present invention. In the present embodiment, a description is provided with respect to performing image processing using an SEM image of a semiconductor pattern, however, it is by no means limited to semiconductor patterns, and it may be anything as long as it is a sample that may serve as a subject for observation.

The measuring/testing system 1 comprises an image processing unit 10, an electron microscope main body unit 20, an SEM image generation unit 30, a control computer 40, an input unit 50, and a display device 60. At the electron microscope main body unit 20, an electron beam 202 emitted from an electron gun 201 is focused by electron lenses that are not shown in the drawing, and irradiates a sample (e.g., a semiconductor chip) 204. The intensity of the secondary electrons or backscattered electrons generated from the sample surface due to electron beam irradiation is detected by an electron detector 205 and amplified at an amplifier 206.

A deflector 203 for moving the position of the electron beam is controlled by a control signal 207 of the control computer 40, and raster scans the electron beam 202 across the sample surface.

The amplified data is supplied to the SEM image generation unit 30, and an SEM image is generated. This generated SEM image is supplied to the image processing unit 10, where predetermined image processing is executed. In addition, the SEM image is displayed on the display device 60, and stored on image memory, which is not shown in the thawing.

The image processing unit 10 comprises: a matching unit 101, which matches (aligns) the SEM image and design data to generate alignment information; a pattern in/out definition information generation unit 102, which generates pattern in/out definition information defining the inside and outside of the pattern with respect to the semiconductor pattern based on the alignment information (indicating which portions are the interior and the exterior); an edge enhancement unit 103, which generates an edge-enhanced image by enhancing the edges in the SEM image; a pattern in/out separation unit 104, which separates the interior and the exterior of the pattern based on the edge-enhanced image and the pattern in/out definition information and outputs pattern in/out separation information; and a contour generation unit 105, which generates SEM contours based on the pattern in/out separation information.

The input unit 50 is an input means, e.g., a keyboard, a mouse, etc., and is a tool for inputting current values and voltage values for controlling the electron microscope main body unit 20, for inputting the design data of the semiconductor pattern for which an SEM image has been obtained with an electron microscope, and so forth. It is noted that, for the design data, data stored on the image memory may also be read.

<Output Information of each Unit of the Image Processing Unit 10>

Figure 2:
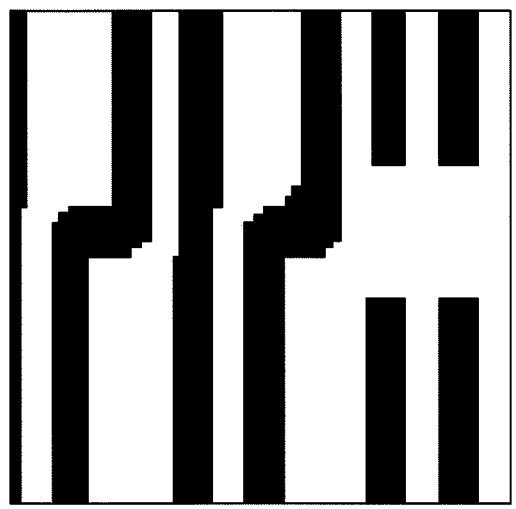
FIG. 2 is a diagram showing an example of design data.
Figure 3:
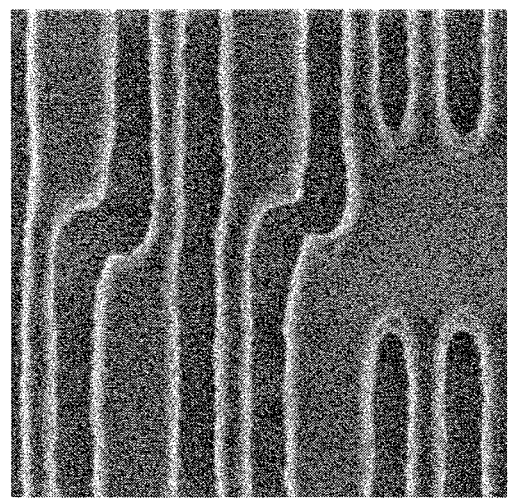
FIG. 3 is a diagram showing an example of an SEM image of a semiconductor pattern.

FIG. 2 shows an example of design data. For purposes of convenience, it is defined in this case that the white parts are pattern interiors, and the black parts pattern exteriors. In addition, FIG. 3 shows an SEM image of a semiconductor pattern created from this design data.

Figure 4:
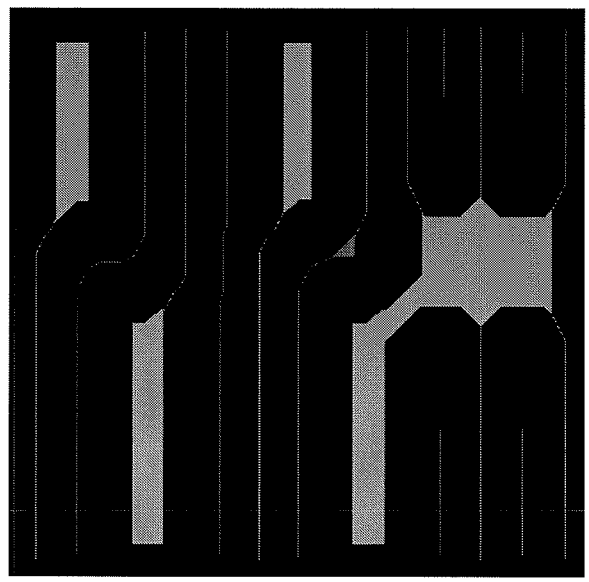
FIG. 4 is a diagram showing an example of pattern in/out definition information.
Figure 4:
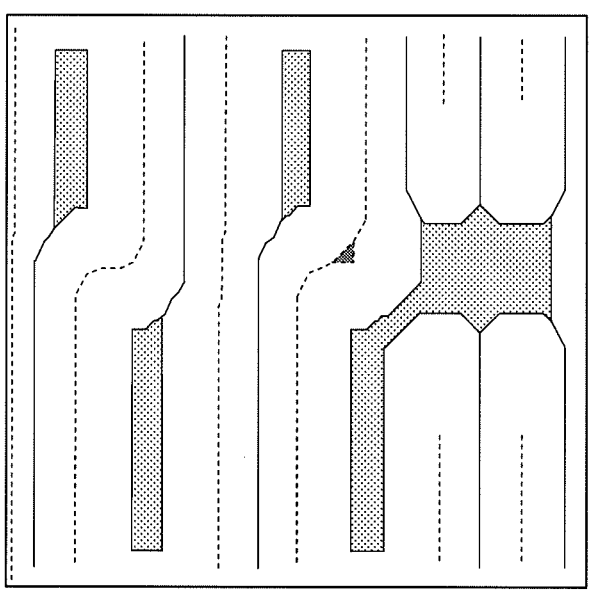

FIG. 4 shows corresponding pattern in/out definition information. FIG. 4(a) is obtained by performing a thinning process on the white regions (e.g., pattern interiors) and black parts (pattern exteriors) shown in FIG. 2. Specifically, the pattern in/out definition information is created by performing a peeling (thinning) process (a process in which one pixel is deleted (removed) from the perimeter, but in which parts that have become one pixel in width are not deleted) a prescribed number of times on an image in which the respective regions of interiors and exteriors in the design data are filled out. In addition, FIG. 4(b) is a diagram in which, in order to render FIG. 4(a) easier to view, the pattern in/out definition information appearing in FIG. 4(a) is represented in a simplified manner.

Figure 5:
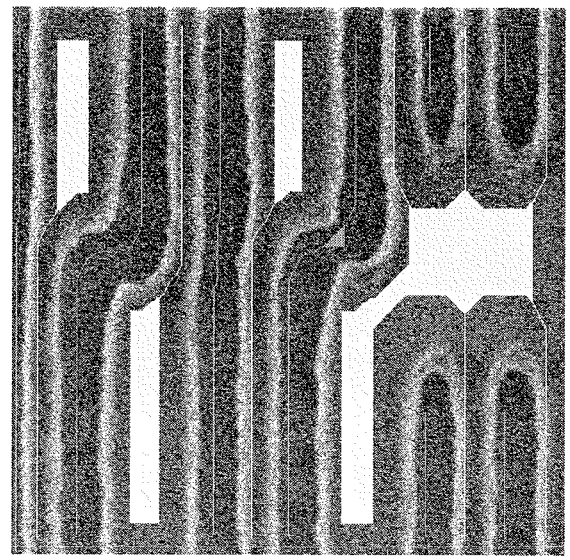
FIG. 5 is a diagram showing a state where pattern in/out definition information is superimposed on an SEM image.

Since the pattern in/out definition information is created with the alignment information between the design data and the SEM image taken into consideration, when, as shown in FIG. 5, it is displayed by being superimposed on the SEM image, it can be seen that the brightest regions define pattern interiors, and that the subsequently brightest regions define pattern exteriors. Accordingly, it can be seen that the boundaries (edge parts) between pattern interiors and exteriors lie between pattern interior definition information and pattern exterior definition information.

Figure 6:
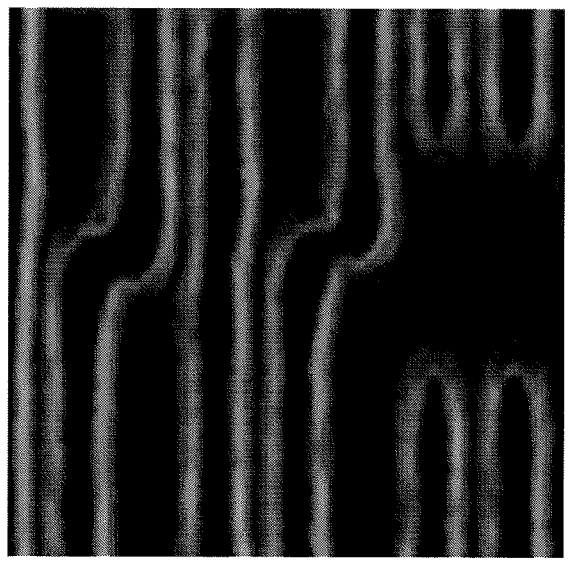
FIG. 6 is a diagram showing an edge-enhanced image generated from an SEM image.
Figure 7:
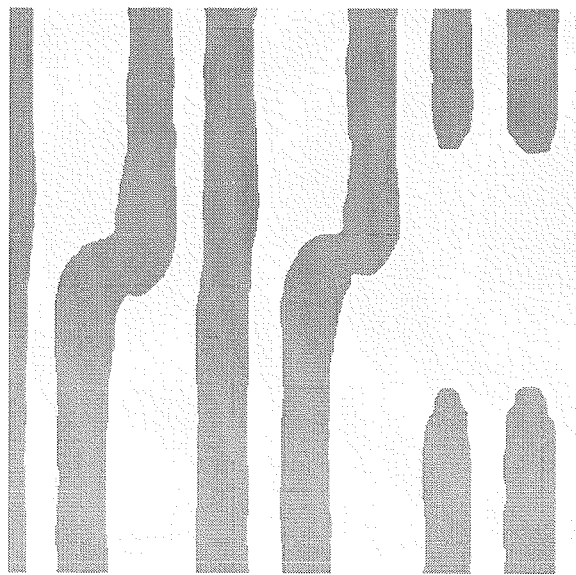
FIG. 7 is a diagram showing pattern in/out separation information generated from pattern in/out definition information.

In addition, FIG. 6 shows an edge-enhanced image created by performing a filtering process, etc., on the SEM image. FIG. 7 shows pattern in/out separation information. The pattern in/out separation information is information that is obtained by expanding the lines respectively representing the interiors (the brightest parts) and the exteriors (the subsequently brightest parts) in FIG. 4 so that parts of the edge-enhanced image with high luminance values become boundaries (the darkest parts) between the interiors and exteriors defined by the pattern in/out definition information (expanding the respective lines until the interiors and the exteriors become connected), and by separating the entire image into pattern interiors and exteriors. Details of this process will be discussed later.

Figure 8:
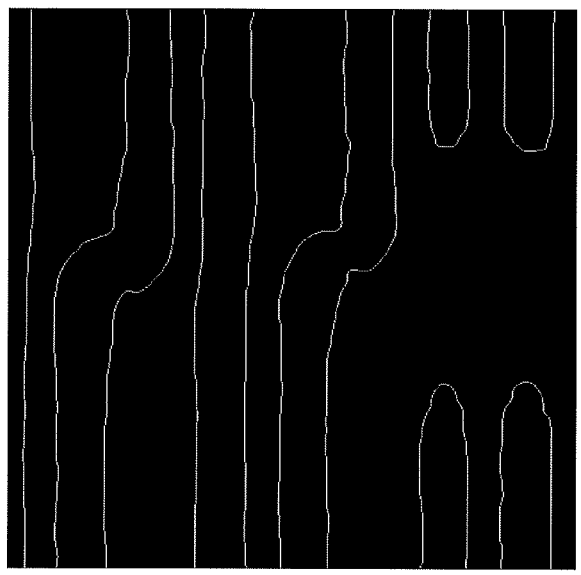
FIG. 8 is a diagram showing SEM contours generated through a process of the present invention.
Figure 9:
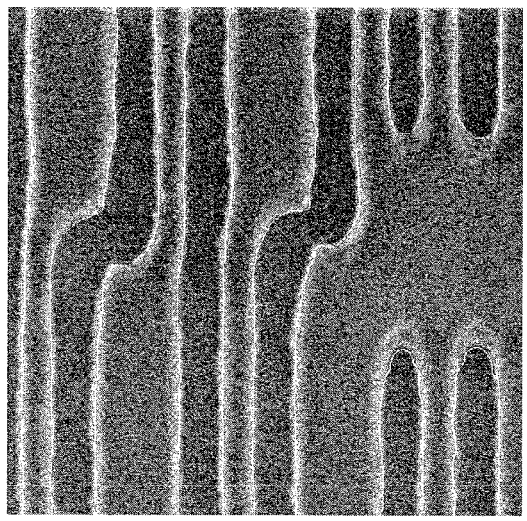
FIG. 9 is a diagram showing a situation where SEM contours and an SEM image are superimposed on each other.

FIG. 8 shows SEM contours created by the contour generation unit 105 as boundaries between the interiors and exteriors of the pattern in/out separation information. Further, FIG. 9 shows the SEM contours in FIG. 8 superimposed on the SEM image in FIG. 3. Thus, it can be seen that SEM contours are indeed successfully obtained.

<Details of the Process by the Pattern In/Out Separation Unit>

The unit (pattern in/out separation unit) that generates the pattern in/out separation information from the pattern in/out definition information and the edge-enhanced image performs a process pursuant to MCWS (Marker Controlled Watershed Segmentation). First, before explaining MCWS, Watershed Segmentation, on which it is based, will be described.

(i) Watershed Segmentation

In Watershed Segmentation, region segmentation is performed on an edge-enhanced image in which edge evidence with respect to each pixel in the original image (e.g., an SEM image) is expressed with a pixel value. If the edge-enhanced image is looked at as landscape information (where the luminance value of a pixel is taken to be its altitude), the edge parts are like high mountain ranges, and the remaining parts are like basins partitioned by the mountain ranges of edges. When such a landscape is flooded in such a manner that the water level (corresponding to the luminance values of the pixels) is kept uniform for the entire image, many catchments will appear as the water level rises, they will then merge with one another, and the whole landscape will eventually be flooded. Each time a new catchment is created in this process, a different label is assigned to that catchment, and the pixels belonging to each catchment are categorized into the region identified with that catchment's label. Although the catchments grow bigger as the water level rises and at some point merge with neighboring catchments, the merging locations become region boundaries. The region boundaries would be of a configuration obtained by connecting the ridges of the mountain ranges. As these ridges divide the catchments, this region segmentation method is referred to as watershed.

Figure 10:
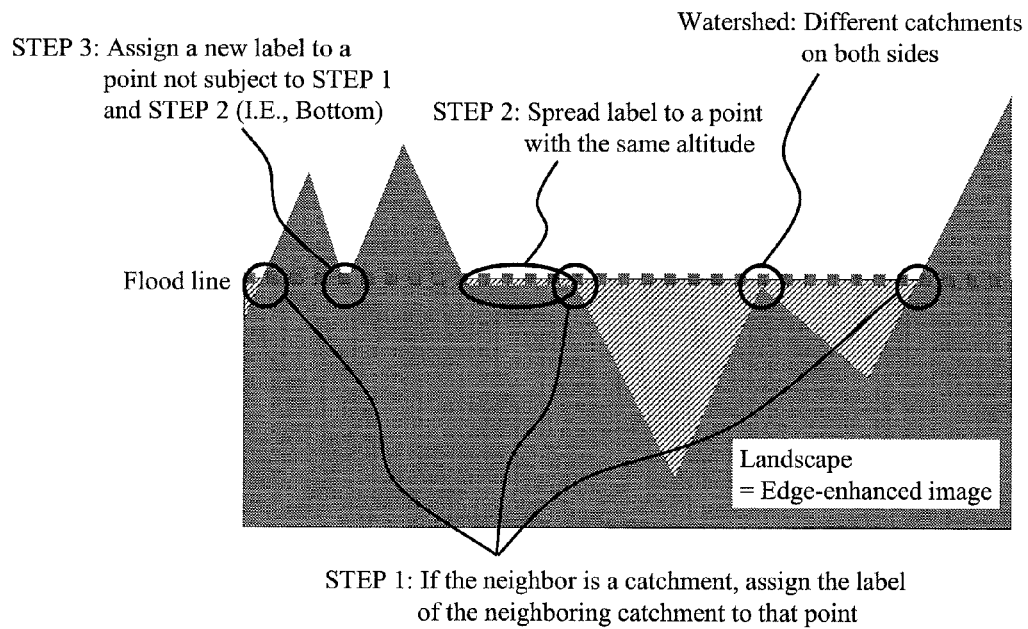
FIG. 10 is a diagram illustrating the Watershed Segmentation method.

FIG. 10 is a diagram conceptually showing an example of an algorithm for realizing Watershed Segmentation. In FIG. 10, the bold dotted line represents a flood line (the line of intersection between the water surface and the landscape) at a given water level. The water level is moved from the altitude of the lowest point of the landscape up to the altitude of the highest point. At each water level, the following three steps are executed for all pixels along the flood line.

STEP 1: If the neighboring pixel is a catchment, assign the label of the neighboring catchment to that pixel as well.

STEP 2: Spread the same label to a neighboring pixel along the flood line.

STEP 3: Assign new labels to pixels that were not subject to STEPS 1 and 2 (bottom of a basin, a new catchment). When visualizing how the water level rises in Watershed Segmentation, the image of "slowly immersing a landscape made of sponge into a bath tub" or the image of "slowly immersing, into a bath tub, a topographical plastic plate with recesses and protrusions in which small holes are opened in the bottoms of the basins" is more apt than the image of "rain falling and water accumulating." This is because, with rain, there is no guarantee that the water level would be uniform. Since Watershed Segmentation involves region segmentation that is finer than necessary, it cannot be applied to contour creation as is.

(ii) MCWS (Marker Controlled Watershed Segmentation)

Based on knowledge of ordinary Watershed Segmentation, MCWS will now be described. MCWS is an improvement of Watershed Segmentation, and enables control of the manner of region segmentation via markers. If the manner in which the water level rises in Watershed Segmentation is thought of as "slowly immersing a landscape made of sponge into a bath tub," then for MCWS, one may think of a situation where only the marker parts (corresponding to line segments of in/out definition information) are made of sponge, and the remaining parts are made of a material that does not allow water through (e.g., plastic). In addition, if the manner in which the water level rises in Watershed Segmentation is thought of as slowly immersing, into a bath tub, a topographical plastic plate with recesses and protrusions in which small holes are opened in the bottoms of the basins," then for MCWS, one may think of a situation where only holes of the same shapes as the markers are opened and no other holes are present (even at the bottoms of the basins).

By thus designating markers, the number of regions ultimately segmented would mirror the number of markers, and every region would include a marker. The markers may be of any shape, be it a point, a line, or a plane. In addition, although labels are assigned to each of the markers, the same label may be assigned to a plurality of markers. In this case, even if catchments with the same label were to be merged, that location would not be recognized as a boundary, and the number of regions would be equal to or less than the number of markers but equal to or greater than the number of labels.

Figure 11:
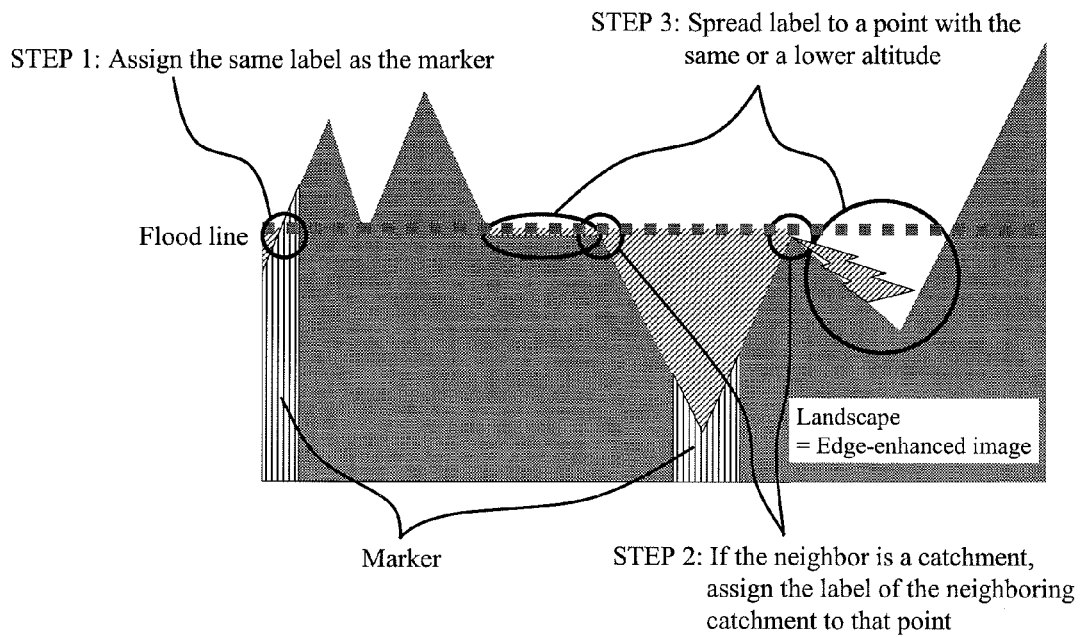
FIG. 11 is a diagram illustrating the Marker Controlled Watershed Segmentation (MCWS) method.

FIG. 11 is a diagram conceptually illustrating an example of an algorithm that realizes MCWS. The diagram may be viewed the same way as FIG. 10. The following three steps are executed at each water level (they are not performed for all pixels along the flood line).

STEP 1: For a pixel on a marker, assign the same label as the marker.

STEP 2: If the neighboring pixel is a catchment, assign the label of the neighboring catchment to that pixel as well.

STEP 3: Spread the same label to a neighboring pixel that lies along the flood line or whose altitude is at or below the water level, and to which a label has not been assigned.

What is characteristic when compared to ordinary Watershed Segmentation is that there is no longer any assignment of new labels, and the order of the steps has changed recursively (1, 2, 3→3, 1, 2) in order to pass on the label of the marker, as well as the fact that the spreading of a label in STEP 3 of MCWS (corresponding to STEP 2 of ordinary Watershed Segmentation) is also performed with respect to pixels whose altitudes are at or below the water level, that is, an overflow of the catchment is taking place. A basin without a marker is assigned a label due to an overflow of the neighboring catchment with a ridge in-between, and the overflow occurs from a catchment that is adjacent via the lowest point among the ridges surrounding the basin.

It is noted that the pattern in/out definition information in FIG. 4 is the markers in MCWS, and the brightest regions and the subsequently brightest regions represent marker regions with different labels. In addition, the edge-enhanced image in FIG. 5 corresponds to landscape information. Further, FIG. 7 represents how the image as a whole is segmented into two regions, namely pattern interiors and pattern exteriors, through MCWS that has markers as pattern in/out definition information.

Since contours (boundaries between the inside and the outside of a pattern) are thus derived from pattern in/out definition information, even if there is a possibility that the edge-enhanced image might by partially discontinuous, the obtained contours would never be discontinuous.

(2) Second Embodiment

The second embodiment relates to another form of the pattern in/out definition information generation unit. The other features and operations are similar to those of the first embodiment, and descriptions will therefore be omitted.

Figure 12:
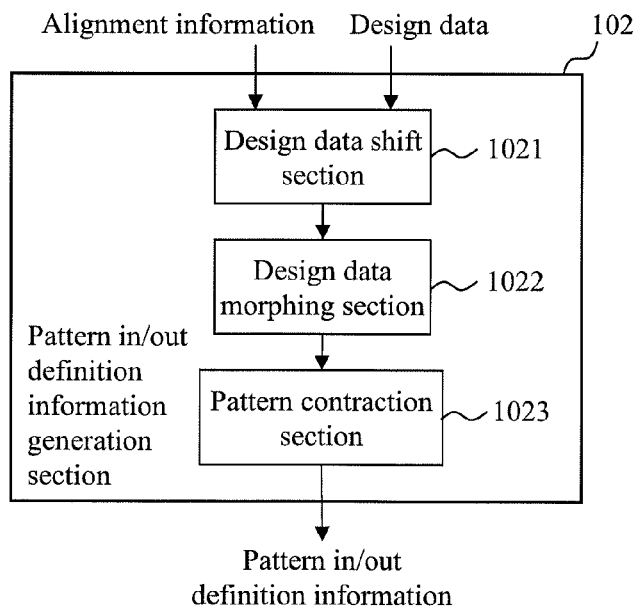
FIG. 12 is a diagram showing an internal configuration of a pattern in/out definition information generation unit according to the second embodiment of the present invention.

FIG. 12 is a diagram showing another form of the pattern in/out definition information generation unit 102 according to the second embodiment of the present invention. As shown in FIG. 12, the pattern in/out definition information generation unit 102 comprises a design data shift unit 1021, a design data morphing unit 1022, and a pattern contraction unit 1023.

Based on alignment information, the design data shift unit 1021 shifts design data to a position where the SEM image and the pattern overlap (superimposition process). Next, the design data morphing unit 1022 morphs the shifted design data in such a manner that the shape of the design data becomes closer to the pattern shape of the SEM image (e.g., blurring the design data with a low-pass filter). Finally, the pattern contraction unit 1023 performs peeling on the morphed design data to generate pattern in/out definition information (thinning process).

Figure 13:
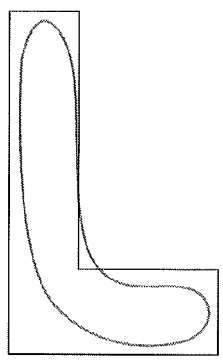
FIG. 13 is a diagram illustrating the concept of a pattern in/out definition information generation process according to the second embodiment.
Figure 13:
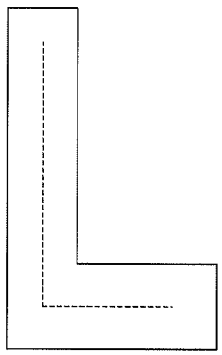
Figure 13:
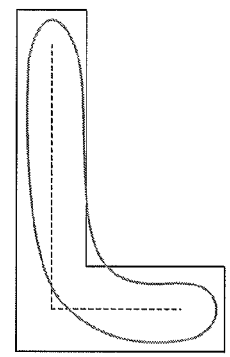
Figure 13:
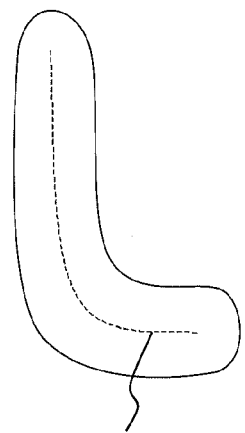
Figure 13:
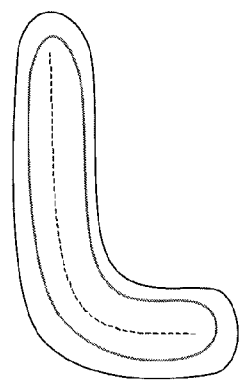

FIG. 13 is a diagram illustrating a process executed at the pattern in/out definition information generation unit 102 shown in FIG. 12. FIG. 13(a) is a superimposed display of design data (black) and a semiconductor pattern created based thereon and observed with an SEM. Semiconductor patterns generally have a more round shape where the corners are rounded off as compared to design data.

From FIG. 13(b), it can be seen that the shape generated from the design data in FIG. 13(a) through peeling is angular, and that when the semiconductor pattern is superimposed thereon as in FIG. 13(c), the corner part sticks out. As such, FIG. 13(d) has the corners of the angular design data rounded off to bring it closer to the shape of the semiconductor pattern. As methods of rounding design data, such methods as creating a light intensity distribution image (aerial image) as in lithography simulation and deriving a sectional shape that is sectioned at the same luminance level are conceivable. However, more simply, the method may also be one in which the design data is filled out, and a low-pass filter, such as a Gaussian filter with a large window, etc., is applied, thereby providing a substitute for the light intensity distribution image, and so forth. Such tendencies as what kind of pattern shapes result in what degree of shape distortion (rounding) may be studied in advance through simulation, and design data may be rounded based on those tendencies.

The shape obtained by performing peeling on this morphed design data is shown with a dotted line. FIG. 13(e) shows the above with the semiconductor pattern superimposed thereon, and it can be seen here that it does not stick out from the semiconductor pattern.

Figure 14:
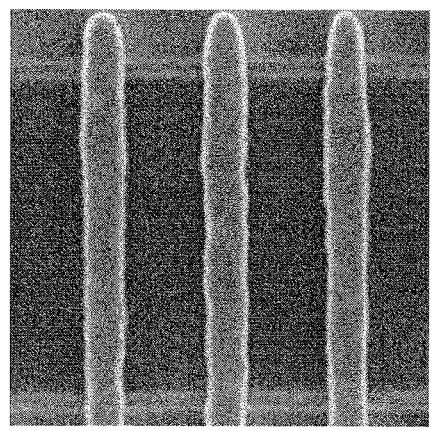
FIG. 14 is a diagram illustrating a process of a pattern in/out definition information generation unit 102 with respect to a case where patterns of a plurality of layers appear in an SEM image.
Figure 14:
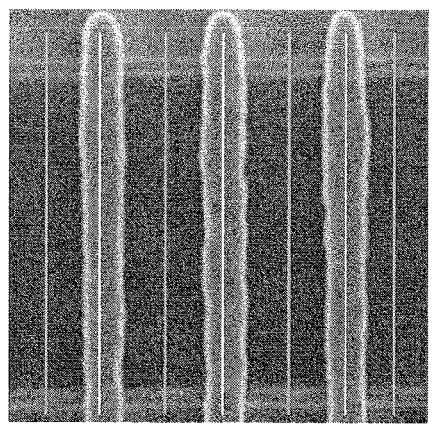
Figure 14:
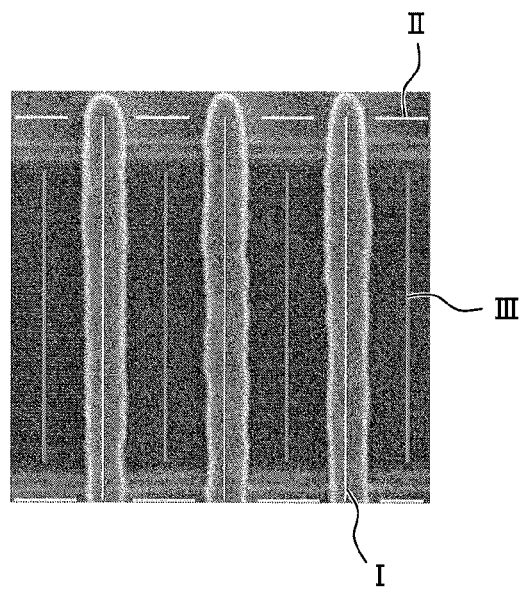

FIG. 14 is a diagram illustrating a process of the pattern in/out definition information generation unit 102 with respect to a case where patterns of a plurality of layers (two layers in this case) are showing in an SEM image. In FIG. 14(a), underneath an upper layer pattern of three line ends parallel in the vertical direction, there appears a lower layer pattern at upper and lower parts that are parallel in the horizontal direction. Here, if only the contours of the upper layer pattern are to be extracted, processing is performed using only the upper layer design data, Since upper layer edges generally show more strongly than lower layer edges, by making two kinds of markers (pattern in/out definition information) for the interior and the exterior of the upper layer design, just the contours of the upper layer may be extracted without being affected by the lower layer edges.

However, if the lower layer edges are showing strongly, taking the lower layer design data into consideration, the upper layer exterior markers are disposed in such a manner as to penetrate the lower layer edges as shown in FIG. 14(b) (categorizing into upper layer and others). Thus, both sides of the edges of the lower layer pattern boundary will be recognized as the same catchment in the MCWS process, and it is possible to eliminate the influence of the lower layer edges.

Similar methods may be used not only for eliminating the influence of lower layer edges, but also for eliminating the influence of false edges that have been incorporated during fabrication. In the case of false edges, since it cannot be determined, from design data, where they will be created, it is also important not to make markers thinner than necessary when generating markers by peeling the design data. Taking alignment precision and pattern shrinkage into consideration, the extent of peeling needs to be defined in such a manner that markers would not penetrate the pattern even if there is an error in alignment and the pattern has shrunk to some degree. However, making them thinner than necessary is not desirable. With respect to parts prone to shrinkage, e.g., line ends, etc., markers may also be greatly degenerated. In addition, the process of carving out markers from design data is by no means limited to peeling.

In addition, if not only the contours of the upper layer pattern but also the contours of the lower layer pattern are to be extracted, markers may be disposed as in FIG. 14(c) using the lower layer design data as well. Specifically, there are three types, namely marker I for the upper layer interior (the brightest marker), marker II for the lower layer interior that is also the upper layer exterior (subsequently brightest marker), and marker III for the lower layer exterior that is also the upper layer exterior (darkest marker).

Among SEM images in which multilayer patterns appear, there are also those in which lower layer edges appear inside the upper layer interior. Although such edges are extremely faint, they become extractable by differentiating types (labels) between a marker for the lower layer interior that is also the upper layer interior and a marker for the lower layer exterior that is also the upper layer interior.

(3) Third Embodiment

The third embodiment relates to another form of the edge enhancement unit. The other features and operations are similar to those of the first embodiment, and descriptions will therefore be omitted.

Figure 15:
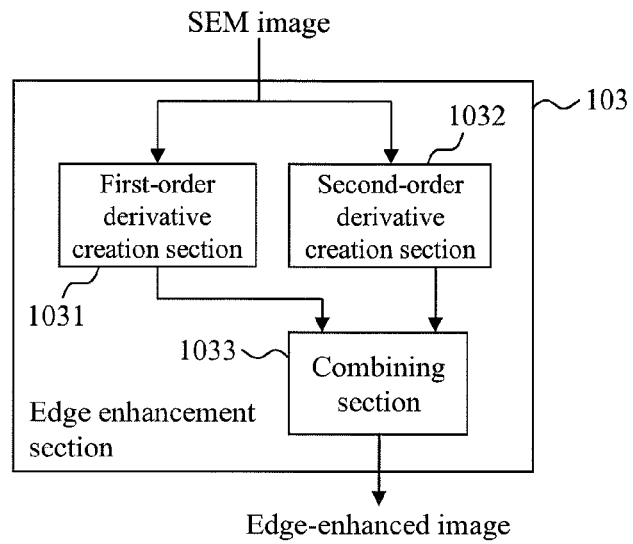
FIG. 15 is a diagram showing a schematic configuration of an edge enhancement unit according to the third embodiment of the present invention.

FIG. 15 is a diagram showing a schematic configuration of an edge enhancement unit according to the third embodiment. This edge enhancement unit 103 comprises a first-order derivative creation unit 1031, a second-order derivative creation unit 1032, and a combining unit 1033.

The first-order derivative creation unit 1031 creates an edge-enhanced image obtained by applying a first-order derivative filter to an SEM image. The second-order derivative creation unit 1032 creates an edge-enhanced image obtained by applying a second-order derivative filter to the SEM image. Examples of a process of the combining unit 1033 may include coordinating the luminance levels of the edge-enhanced image created at the first-order derivative creation unit 1031 and the edge-enhanced image created at the second-order derivative creation unit 1032, thereafter expanding the edge-enhanced image created at the second-order derivative creation unit 1032 using, for example, a maximum filter to create a maximum value image with respect to each pixel, and finally performing smoothing with a low-pass filter.

The first-order derivative creation unit 1031 is able to obtain clear edges for patterns whose interiors are bright and exteriors dark. On the other hand, the second-order derivative creation unit 1032 is able to obtain edges well for patterns whose interiors and exteriors do not differ in brightness but in which white bands are present at the boundaries. In other words, by expanding the edges extracted at the second-order derivative creation unit 1032, with respect to the final smoothing, the drop in luminance value may be suppressed more than the edges extracted at the first-order derivative creation unit 1031. Through this effect, the center of a white band is extracted if the white band is distinct, whereas the step edges with greater variation in contrast are extracted if the white band is unclear. However, unless the contrast variation of either set of step edges is markedly significant, the center of the white band is extracted.

Accordingly, the edges of the edge-enhanced image outputted by the combining unit 1033 generally takes the centers of the white bands of the SEM image, or if there is markedly significant contrast variation in either the step edges on the inside or the outside, those step edges are taken. It thus becomes possible to suppress abrupt changes from the step edges on the inside to those on the outside.

(4) Fourth Embodiment

The fourth embodiment applies an energy function obtained through MCWS to an active contour extraction process with respect to a process of the contour generation unit 105. Here, the snake method and the level set method are given as examples of an active contour extraction process.

It is conceivable that the contour generation unit 105 might execute, besides a process of creating contours, such as those in FIG. 8, as boundaries of regions of pattern in/out separation information such as that in FIG. 7 as discussed above, a process that takes into consideration the plausibility of contours, and corrects contours to be more natural. Before describing an example thereof, the concept of linking cost with respect to markers in MCWS will be described using FIGS. 16 and 17. The linking cost with respect to markers is a function that is defined at all points with respect to the markers of each label.

Figure 16:
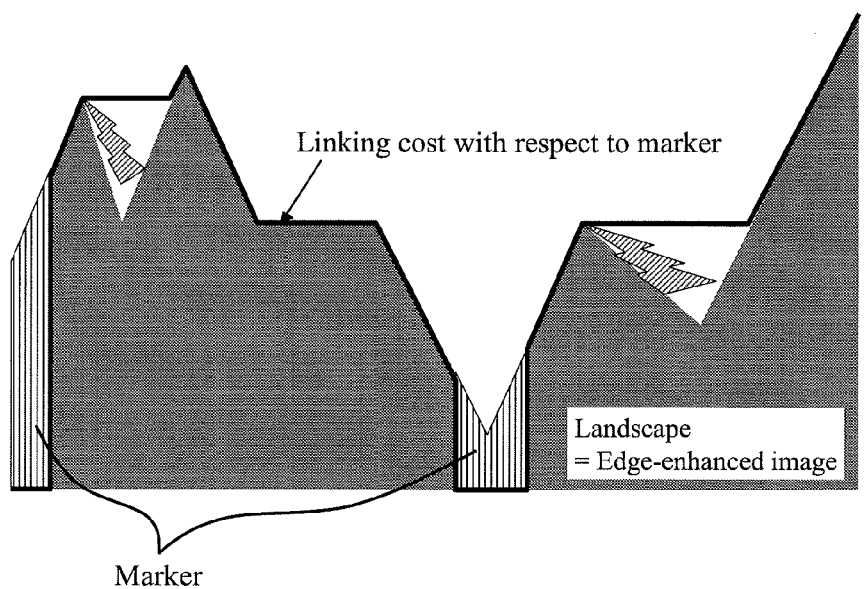
FIG. 16 is a diagram (1) illustrating the concept of linking cost with respect to markers in MCWS.

In FIG. 16, markers of a single type (same label) are found at two places. The linking cost with respect to the markers is generally equal to the altitude of the land surface at each point. However, at points that have submerged below the water level due to an overflow in the process of performing MCWS, it becomes equal to the altitude of the land surface of the overflow point (the point out of which water flowed), that is, the post-overflow water level.

Figure 17:
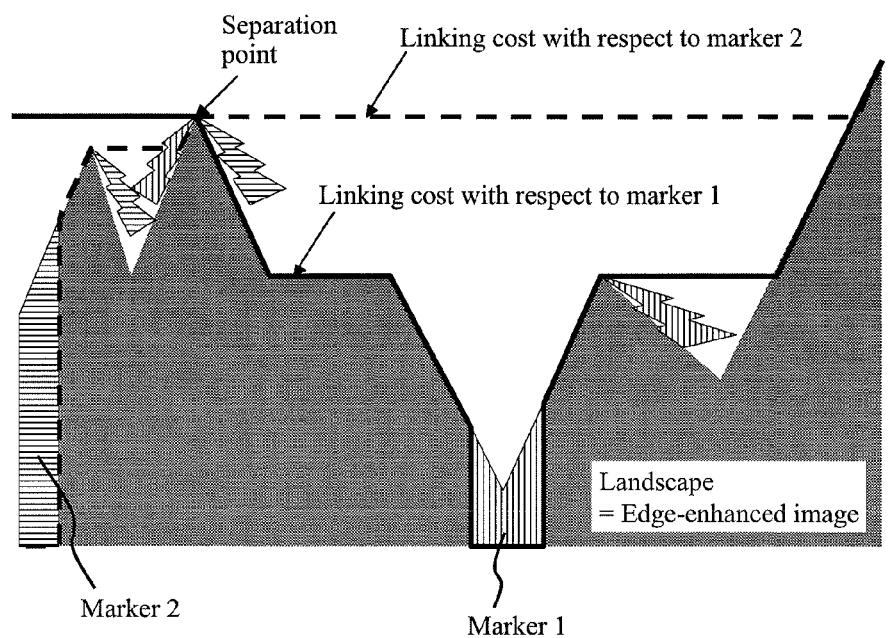
FIG. 17 is a diagram (2) illustrating the concept of linking cost with respect to markers in MCWS.

On the other hand, in FIG. 17, markers of different types (labels) are found at two places. Both the linking cost with respect to marker 1 and the linking cost with respect to marker 2 are defined for each point. The region containing marker 1 and the region containing marker 2 are separated by a set of points at which the linking cost with respect to marker 1 and the linking cost with respect to marker 2 become equal. In other words, that which is obtained by linking points at which the linking cost with respect to marker 1 and the linking cost with respect to marker 2 become equal becomes a region boundary. The pattern in/out separation information may assume the form of linking costs with respect to markers of respective labels instead of pattern in/out region information such as that in FIG. 7.

Then, within the regions containing the markers of the respective labels, reconstruction by erosion is performed with respect to the landscape, and the linking costs with respect to the markers become equal to what is obtained by calculating the topographical distances from the markers.

With respect to FIG. 17, within the image indicated by the solid line, the lower the pixel value is, the more likely it will be determined as being the interior of the marker 1 region. In addition, within the image indicated by the dotted line, the lower the pixel value is, the more likely it will be determined as being the interior of the marker 2 region. Accordingly, if the solid line corresponds to an image of the pattern interior and the dotted line corresponds to an image of the pattern exterior, it is possible to determine interior evidence and exterior evidence from these images.

There is known a technique of creating contours using active contours where the topographical distance from a marker is used as external energy. Representative active contour methods include the snake method and the level set method.

Figure 18:
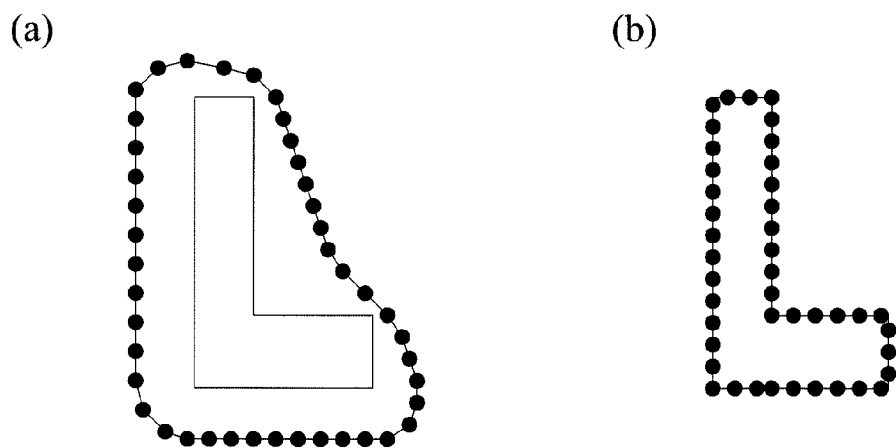
FIG. 18 is a diagram illustrating the snake method.

First, the snake method is described using FIG. 18. FIGS. 18(a) and (b) are diagrams showing the concept of the snake method. As shown in FIG. 18(a), a sequence of points is placed around a shape whose contour is to be determined, and a contour is derived as in FIG. 18(b) by moving the sequence of points in such a manner as to minimize the sum of the external energy and the internal energy. External energy is energy that becomes smallest when the active contour (the sequence of points) overlaps with the contour estimated from the image. Internal energy is energy that becomes smaller the more the active contour (the sequence of points) meets requirements expected of natural edges (e.g., minimal curvature and curve length, etc.). It is noted that the initial values for the sequence of points are so set that, using the image that appears to be the interior of the pattern (e.g., the image indicated by the solid line in FIG. 17) and the image that appears to be the exterior of the pattern (e.g., the image indicated by the dotted line in FIG. 17), the pattern interior is covered while at the same time not protruding into the pattern exterior.

A method that applies snakes using the topographical distance from a marker as external energy is disclosed in Non-Patent Literature 1.

Figure 19:
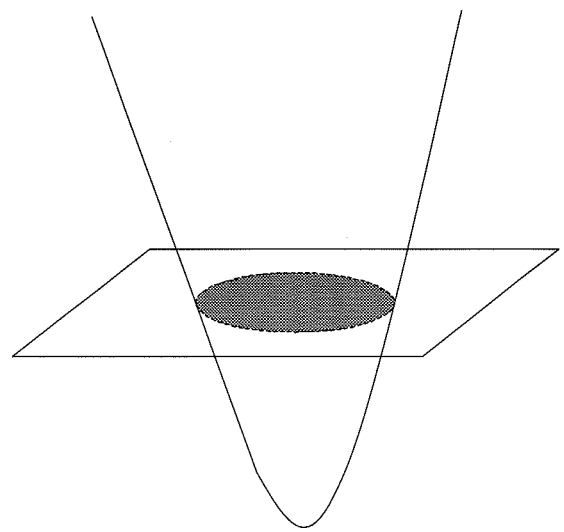
FIG. 19 is a diagram illustrating the level set method.
Figure 19:
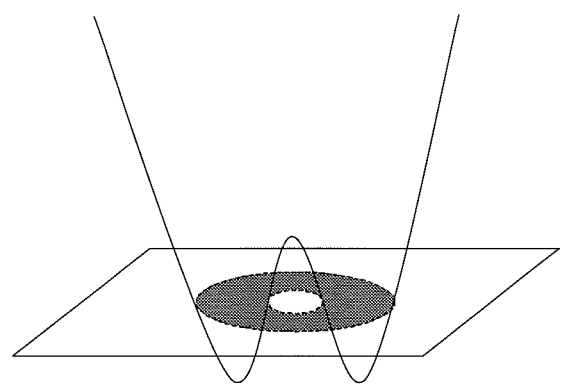

Next, the level set method is described using FIG. 19. In the level set method, instead of representing an active contour with a sequence of points, an active contour is represented as a level line of a one-dimensionally extended curved plane (auxiliary function) as in FIG. 19(a). Changes in the topology of a contour may be represented with ease in the level set method by changing the auxiliary function. A method that applies the level set method using the topographical distance from a marker as external energy is disclosed in Non-Patent Literature 2.

Both the snake method and the level set method allow the use of the linking cost with respect to a marker instead of the topographical distance from a marker. The linking cost with respect to a marker can be created in a shorter period of time than the topographical distance from a marker.

In addition, an edge-enhanced image may be inputted to the contour generation unit 105. By so doing, it is possible to use the edge-enhanced image in creating the external energy.

Because changes in the topology of a contour may be represented with ease in the level set method by changing the auxiliary function, even if defects involving changes in topology, e.g., necking, bridging, etc., were to occur in a semiconductor pattern, it would still be possible to extract contours well.

(5) Conclusion

With the present invention, a thinning process is performed with respect to design data for generating a testing target sample (e.g., a semiconductor wafer), and pattern in/out definition information (which serves as initial regions) defining the inside and outside of a pattern (semiconductor pattern) formed on the target sample is generated. Then, the regions indicated by the pattern in/out definition information are expanded (the initial regions undergo region growth) while referencing the pixel values (luminance values) of the edge-enhanced image of the target sample image, region segmentation is performed with the places at which the inside regions and outside regions of the pattern merge as pattern boundaries, and pattern contours of the target sample are generated. Thus, it is possible to obtain pattern contours without discontinuities, spuriousness, duplication, branches, etc., in the contours.

When generating contours, regions indicated by the pattern in/out definition information are expanded, and region segmentation is performed in such a manner that the inside regions of the pattern overlap with the edge parts indicated in the edge-enhanced image as much as possible (since the obtained edge-enhanced image may sometimes be discontinuous and may not necessarily overlap 100%). By way of example, region segmentation is performed based on the Marker Controlled Watershed Segmentation method. Alternatively, pattern contours of the target sample are generated by executing an active contour extraction process using, from the pattern in/out definition information, external energy indicating a pattern interior region and external energy indicating a pattern exterior region. Examples of this active contour extraction process may include the snake method and the level set method. In the level set method or the snake method, information separating the pattern interior from the exterior contains linking costs relative to the initial regions, or information comparable thereto, and SEM contours are created by means of active contours using this information. It is thus possible to obtain contours that are more natural (particularly in the case of the snake method). In addition, through the level set method, it is made possible for the topology of the regions separated by SEM contours to change. Thus, even if such defects as pattern necking, bridging, etc., were to occur, it would still be possible to obtain semiconductor pattern contours well.

In addition, should the sample image (SEM image) morph to such an extent relative to the design data that the latter cannot envelop the former, the design data is morphed so that the design data envelops the target sample image, and pattern in/out definition information may be generated from the morphed design data. Thus, even if the morphing of the semiconductor pattern were significant, it would still be possible to obtain contours of the semiconductor pattern well.

In addition, an edge-enhanced image may also be created by combining the outputs of a plurality of filters with respect to an SEM image. Contours of a semiconductor pattern may be obtained well even with respect to an SEM image whose white bands are not well sorted.

REFERENCE SIGNS LIST

1: Measuring/testing system
10: Image processing unit
20: Electron microscope main body unit
30: SEM image generation unit
40: Control computer
50: Input unit
60: Display device

The invention claimed is:

1. An image processing device that extracts a contour of a pattern formed on a sample that is a target of measurement or testing, the image processing device comprising:
   a pattern in/out definition information generation unit that performs a thinning process on design data for generating a target sample so that inside and outside regions of the pattern are narrowed and generates pattern in/out definition information defining an inside and an outside of a pattern formed on the target sample and generating the pattern in/out definition information by referencing alignment information obtained through a matching process between the target sample image and the design data;
   an edge enhancement unit that generates an edge-enhanced image of a target sample image obtained by irradiating the target sample with an electron beam; and
   a contour generation unit that performs region segmentation by expanding regions indicated by the pattern in/out definition information while referencing pixel values of the edge-enhanced image and generates a pattern contour of the target sample.

2. The image processing device according to claim 1, wherein the contour generation unit performs the region segmentation by expanding the regions indicated by the pattern in/out definition information in such a manner that a region of the inside of the pattern overlaps with an edge part indicated by the edge-enhanced image.

3. The image processing device according to claim 2, wherein the contour generation unit performs the region segmentation based on a Marker Controlled Watershed Segmentation method.

4. The image processing device according to claim 2, wherein the contour generation unit generates the pattern contour of the target sample by executing an active contour extraction process using, from the pattern in/out definition information, external energy indicating a pattern interior region and external energy indicating a pattern exterior region.

5. The image processing device according to claim 1, wherein the pattern in/out definition information generation unit generates the pattern in/out definition information by performing a peeling process on an image of an interior region and exterior region of the pattern with respect to the design data.

6. The image processing device according to claim 1, wherein the pattern in/out definition information generation unit references alignment information obtained through a matching process between the target sample image and the design data, morphs the design data in such a manner that the design data envelops the target sample image, and generates the pattern in/out definition information from the morphed design data.

7. The image processing device according to claim 1, wherein the edge enhancement unit performs a plurality of filter processes on the sample image, and generates the edge-enhanced image by combining respective filter processed images.

8. A measuring/testing system comprising:
   an electron microscope device that generates a target sample image from information obtained by irradiating, with an electron beam, a sample that is a target of measurement or testing; and
   the image processing device according to claim 1.

9. A non-transitory computer readable medium that stores a program for causing a computer to function as the image processing device according to claim 1.

* * * * *